United States Patent [19]
Borbely

[11] 3,869,674
[45] Mar. 4, 1975

[54] A.F.C. DISABLING CIRCUITRY

[75] Inventor: Erno Borbely, Newton Square, Pa.

[73] Assignee: Dynaco Inc., Philadelphia, Pa.

[22] Filed: Dec. 26, 1972

[21] Appl. No.: 318,345

[52] U.S. Cl. .......... 325/422, 178/5.8 AF, 325/346, 325/423, 331/36
[51] Int. Cl. .......... H04b 1/14, H04b 1/26
[58] Field of Search .......... 325/416–423, 325/344, 346, 453, 464, 470, 473; 178/5.8 AF; 331/16, 18, 34, 36

[56] References Cited

UNITED STATES PATENTS

| | | | |
|---|---|---|---|
| 2,831,106 | 4/1958 | Clark | 325/348 |
| 3,343,092 | 9/1967 | Davids et al. | 325/423 |
| 3,582,793 | 6/1971 | Bates et al. | 325/418 |

*Primary Examiner*—Benedict V. Safourek
*Assistant Examiner*—Marc E. Bookbinder
*Attorney, Agent, or Firm*—Hyman Hurvitz

[57] ABSTRACT

A superheterodyne f.m. receiver having a manually tunable and voltage tunable local oscillator and a ratio detector for providing audio output signal and a.f.c. voltage in response to a received carrier and an a.f.c. channel for conveying the a.f.c. voltage to the local oscillator to maintain precise tuning of the latter, wherein is provided a switch for opening the a.f.c. channel and logic circuitry responsive to the a.f.c. voltage for controlling the switch to open the channel only when (1) the a.f.c. voltage exceeds predetermined levels, and (2) in response to interchannel noise, the a.f.c. channel including a voltage limiter for limiting a.f.c. voltage.

11 Claims, 2 Drawing Figures

PATENTED MAR 4 1975

3,869,674

A.F.C. DISABLING CIRCUITRY

BACKGROUND

It is a problem in the art of superheterodyne f.m. receivers to assure that the receivers are precisely tuned. This problem has been solved in the past by locking the local oscillator to correct tuning by means of an a.f.c. loop. However, the problem remains that the a.f.c. control may lock on an undesired channel, or on noise, preventing tuning to a desired signal, and also that once tuned to a desired signal the a.f.c. loop may render detuning difficult.

This problem has been partially solved in the past by breaking the a.f.c. loop when the a.f.c. voltage exceeds predetermined limits and also in response to interchannel noise. See Clark U.S. Pat. No. 2,831,106. According to the present invention, the a.f.c. circuit operates normally within predetermined carrier frequency deviations from correct value, but on exceeding these deviations the a.f.c. circuit is grounded by a transistor switch. The grounding switch is also responsive to interchannel noise. To enable detuning, the amplitude of the a.f.c. voltage is limited so that the local oscillator cannot be maintained at the frequency called for by the a.f.c. loop beyond a predetermined value of a.f.c. voltage. Beyond this point, the a.f.c. voltage can continue to increase as detuning proceeds, until the a.f.c. circuit grounding switch becomes operative. At this point the tuning knob of the receiver assumes full control. Absent the limiting control, the a.f.c. circuit would maintain the receiver tuned to the last channel to which it had been tuned, which would tend to prevent detuning at least until the f.m. detector was no longer able to further increase its a.f.c. output. By utilizing a combination of an a.f.c. circuit grounding switch responsive to a.f.c. voltages exceeding predetermined limits, and by also limiting the a.f.c. voltage, the a.f.c. circuit can be interrupted at precisely predetermined frequency deviations from correct tuning both during tuning and detuning.

SUMMARY

An f.m. receiver of the superheterodyne type having an a.f.c. circuit wherein is provided logic circuitry for interrupting the a.f.c. circuit in response to interchannel noise and to application to the logic circuitry of an a.f.c. voltage exceeding a predetermined limit and in which the a.f.c. circuit includes a voltage limiter to enable interruption of the a.f.c. circuit on detuning of the receiver.

DRAWINGS

FIG. 1 is a diagram partly in block and partly schematic of the system of the invention; and FIG. 2 is a plot illustrating the limiting frequencies encountered in a preferred embodiment of the system of FIG. 1.

DETAILED DESCRIPTION

Figures 1, 2:
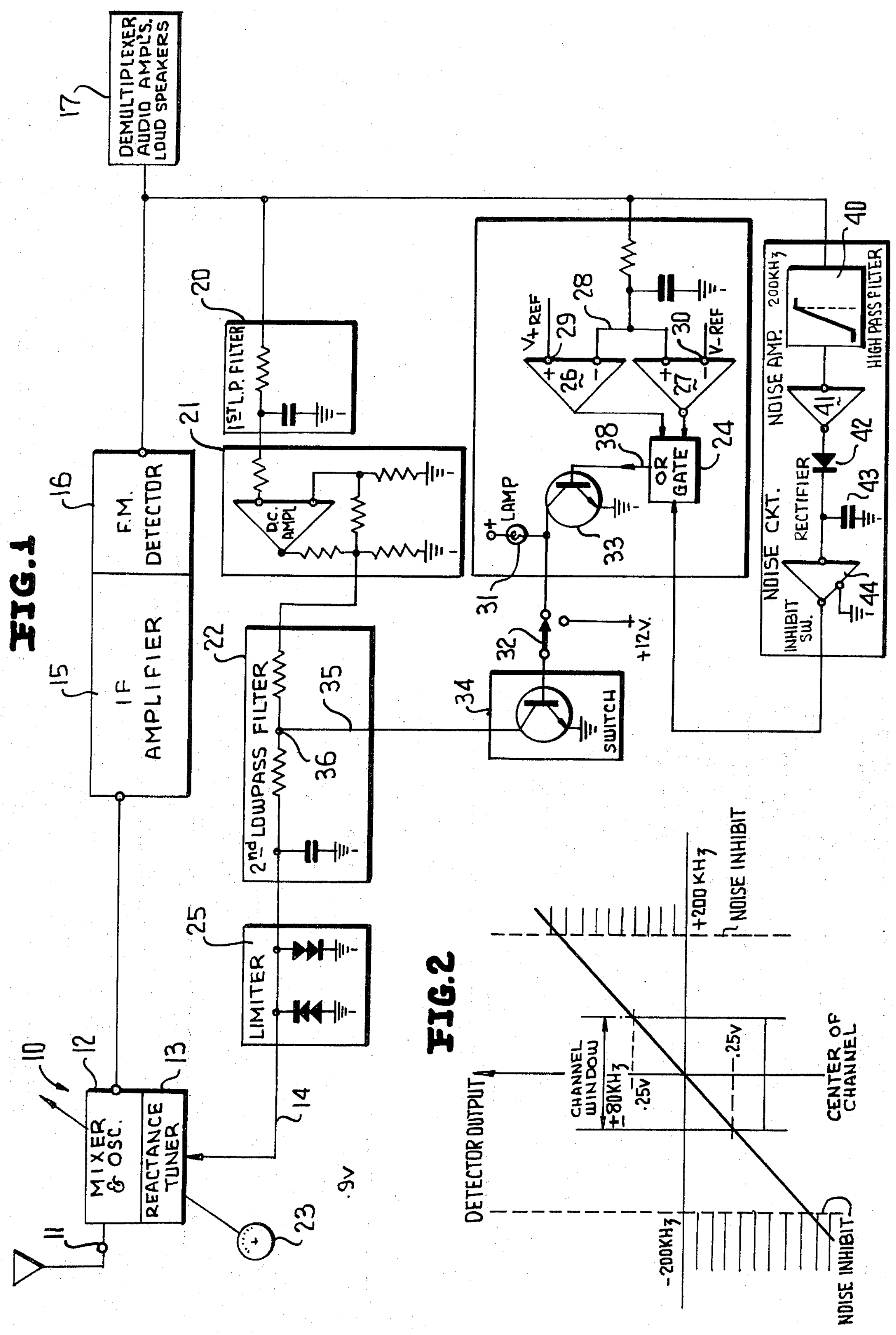

In FIG. 1, 10 represents the front end of a conventional stereophonic f.m. receiver including antenna or input terminal 11, local oscillator and mixer 12 and a reactance tuner 13 for the local oscillator which is responsive to a.f.c. voltage applied via lead 14 to control the frequency of the local oscillator. The desired output of the mixer is selected and amplified by i.f. amplifier 15, and the output of the latter is detected in f.m.

audio detector 16, which may be specifically a ratio detector. The output of the f.m. detector 16 is an audio voltage containing multiplexed stereophonic signal, which is demultiplexed into right and left channels, amplified and applied to separate loudspeakers by unit 17. Receivers of this type are completely conventional, are widely sold commercially, and therefore require no detailed exposition. They have the property, well known, that when the receiver is detuned from an f.m. carrier a d.c. voltage is developed by the f.m. detector, which has a polarity and magnitude representing the amount of detuning. This d.c. voltage is conventionally utilized to automatically control the local oscillator frequency, so that when the receiver is approximately tuned to a desired channel the control circuit (a.f.c.) precisely fine tunes the local oscillator to that channel and maintains the tuning. According to standard practice, the output of f.m. detector 16 is filtered by a low pass filter 20 to remove audio components and retain slowly varying d.c. voltage, that voltage is amplified by d.c. amplifier 21, and the output of the latter passed via a second low pass filter 22 to the reactance tuner 13, via limiter 25, the circuitry being so arranged as to maintain the receiver precisely tuned to or locked on a channel which has been selected by manual control knob 23. Whenever a carrier is received, then, an a.f.c. voltage develops which tunes the local oscillator in such sense and amount as to tend to reduce the a.f.c. voltage to zero, and maintains receiver precisely tuned to that carrier.

If, now, one commenced tuning with the a.f.c. circuit operative, the receiver would tend to lock on the first carrier which it found, and to hold that carrier despite rotation of knob 23 over a considerable tuning range. This could render it impossible to tune from an undesired channel to a desired adjacent channel.

According to one feature of the invention, a two sided limiter 25 is inserted in series with the a.f.c. channel, following second low pass filter 22. This limiter which operates at a low current limits a.f.c. voltage in either polarity to less than two diode voltage drops, about 0.9V. The a.f.c. loop therefore has only limited ability to maintain tuning to any channel, as one seeks to detune by turning knob 23. As one detunes manually, the a.f.c. voltage rises, opposing the change in tuning. But, in due course the reactance tuner requires greater and greater a.f.c. voltage to maintain tuning, and when the limiter prevents further increase in a.f.c. voltage, the receiver tuning unlocks and knob 23 assumes complete control.

As one tunes to a channel, on near approach to the channel from either side, an a.f.c. voltage develops which is applied in parallel to the inputs 28 of high gain operational amplifiers 26 and 27. These have respectively positive and negative reference voltages applied at terminals 29 and 30, respectively, and have outputs that are fed into "OR gate" 24. The output of "OR gate" 24, lead 38, is +12.V when the a.f.c. voltage applied lies between the reference voltages, and zero when the reference voltages are exceeded. Operational amplifiers and "OR gates" of the type employed are well known per se, and accordingly circuitry and discussion of operation are not provided. The output signal on lead 38, either 12 volts or zero, depending on the value of the a.f.c. voltage, is applied to a transistor switch or amplifier 33 having a lamp load 31 in its collector circuit and a grounded emitter. The lamp is thus turned on or energized if +12.V is present on lead 38 and off if zero volts is present, and serves as a tuning indicator.

The output on lead 38 via amplifier 33 is also applied via manual switch 32 to the base of grounding transistor switch 34, having a grounded emitter and its collector connected by lead 35 to a point 36 of the second low pass filter, so that when switch 34 is conductive the a.f.c. circuit is inoperative. Manual switch 32 can apply +12V. to switch 34 at will to remove a.f.c.

The output of f.m. detector 16 is also applied to a high pass filter 40, having a cut-off at about 200 kHz. It is well known that between channels an f.m. receiver generates supersonic noise. Accordingly, filter 40 produces output only while the receiver is tuned between channels and provides no output in response to audio signals. The noise signal passed by filter 40 is amplified in amplifier 41, detected by a detector comprising series diode 42 and shunt capacitor 43, and applied via an inhibit switch 44 to input of "OR gate" 24. In the presence of noise, the output of the inhibit switch 44 is such as to drive the output of "OR gate" 24 toward zero. This output via amplifier 33 and switch 32 will cause transistor switch 34 to be energized, thus disabling the a.f.c. circuit.

OPERATION

The automatic tuning logic circuit may be thought of as a highly amplified tracking circuit with a narrow "window." The detector's d.c. output is amplified by a high gain operational amplifier 21. Feedback of this output to the front end through a switch and limiter controls the oscillator frequency and tracks for zero d.c. at the detector output. With proper alignment the zero d.c. detector output can be assured of being the minimum distortion point.

The switch 34 between the output of the d.c. amplifier 21 and the reactance control 13 is controlled by operational amplifiers 26, 27 and noise inhibit circuit 40 – 44. An "or gate" 24 provides the logic, so that point 36 is grounded when the output of inhibit switch 44 is zero or when the input voltage to operational amplifiers 26, 27 exceeds the reference limits.

When tuned between stations, the f.m. detector 16 output is 0 vdc, and would therefore permit the output of "OR gate" 24 to go to +12V. However, concurrent presence of interstation noise will operate the inhibit switch 44, keeping point 36 at 0 vdc, and therefore disconnecting the output of the high gain d.c. amplifier from the tracking reactance in the reactance tune 13, a capacitor diode in the present instance.

When approaching a station in the tuning process, the onset of a broadcast signal overcomes the noise and switches off the inhibit switch. However, the detector's d.c. output voltage at this point is initially either greater than the allowable positive reference, or less than the allowable negative reference level, and via the "OR gate" 24 maintains the a.f.c. circuit switched off. Only when manual tuning approaches within 80 kHz of the center of the channel will the detector output be within prescribed limits, allowing the amplifier 33 output to go to O V., thus rendering the a.f.c. circuit operative, or closing the a.f.c. servo loop, and the circuit will then track for 0 vdc detector output.

The servo loop error signal having locked on a channel, would remain locked on that channel if it were not switched off. To provide adequate "window" width for easy tuning manual detuning can reach up to 230 kHz beyond the center of channel before limiter 25 between the switch 34 and the front end causes the d.c. output of detector 16 to change sufficiently that the operational amplifiers 26, 27 notes the change and switches off the servo loop at switch 34.

When approaching a station from either the high or the low side the action is complementary, allowing a narrower tuning deviation of 80, kHz on the entering side than the 200, kHz employed on the exit side, as indicated in FIG. 2 of the accompanying drawings.

I claim:

1. In a frequency modulation receiver having a local oscillator for varying the intermediate frequency output of a mixer, a frequency detector through which said intermediate frequency output is converted into a bipolar a.f.c. signal of a substantially zero output level at the center frequency of a broadcast channel to which the receiver is tuned, means for detecting inter-channel noise, automatic tuning means connected to the local oscillator including an a.f.c. circuit connected to the frequency detector for tracking the zero output level of said a.f.c. signal, logic means connected to the frequency detector for rendering said a.f.c. circuit operative in response to said a.f.c. signal only when said bipolar a.f.c. signal is below a predetermined output level of either polarity representing a relatively wide frequency deviation from said center frequency less than that at which interchannel noise is detected by said means for detecting interchannel noise and otherwise rendering said a.f.c. circuit inoperative, means responsive to said means for detecting interchannel noise for rendering said logic operative to render said a.f.c. circuit inoperative in response to said interchannel noise, and means connected in said a.f.c. circuit for limiting said a.f.c. signal as applied directly to said automatic tuning means to a level substantially less than said predetermined output level.

2. The combination according to claim 1, wherein said interchannel noise is detected at a frequency separation from said center frequency of the order of 200. KHz and wherein said relatively wide frequency deviation is of the order of 80. KHz wide.

3. In a frequency modulation receiver having a local oscillator for varying the intermediate frequency output of a mixer, a frequency detector through which said intermediate frequency output is converted into a bipolar dc a.f.c. signal of substantially zero output level at the center frequencies of broadcast channels to which the receiver is tuned; automatic tuning means connected to the local oscillator; a feedback circuit connected between said frequency detector and said automatic tuning means for tracking the zero output level of said dc signal, logic means connected to said frequency detector for rendering said feedback circuit operative in response to said dc signal only while said dc signal is below a predetermined output level of either polarity, inhibit means having an input connected to said detector and an output connected to said logic means for disabling said feedback circuit in response to interchannel noise, and limiting means connected in the feedback circuit for further limiting said tracking thereof to predetermined positive and negative a.f.c. signal levels.

4. The combination of claim 3, wherein said logic means includes a sensing circuit connected to the frequency detector for producing a control signal in response to reception of said a.f.c. signal below said predetermined output level, and switching means connected to the feedback circuit for rendering said feedback circuit operative in response to said control signal to establish frequency deviation limits with respect to said center frequency between which said feedback circuit tracks the zero output level of the audio signal, wherein said frequency deviation limits form a frequency range narrower than said predetermined deviation of said limiting means connected in said feedback circuit.

5. The combination of claim 4, wherein said sensing circuit includes a bipolar sense amplifier having inputs respectively connected to the frequency detector and the inhibit means and an output connected to the switching means.

6. In a frequency modulation receiver, a frequency detector and a reactance tuner responsive to a signal from said detector, said signal approaching zero level when said tuner is tuned to the center frequency of a broadcast channel, feedback circuit means connected to said detector for automatically tuning said reactance tuner toward said center frequency only while said signal represents predetermined frequency deviation limits from said center frequency, means responsive to said signal only when said signal is above a predetermined level for disabling said feedback circuit, and means responsive to interchannel noise for disabling said feedback circuit.

7. In an f.m. stereophonic receiver having a reactance tuned local oscillator, a mixer responsive to the output of said local oscillator and to a received f.m. signal, an i.f. amplifier responsive to the output of said mixer, and an f.m. detector having an a.f.c. output responsive to the output of said i.f. amplifier, a feedback loop conveying said a.f.c. output to said reactance tuner, said feedback loop including low pass filter means, said feedback loop further including a two-sided limiter in cascade with said low pass filter, whereby the a.f.c. voltage applied to said reactance tuner is inhibited from exceeding pre-determined limits in either polarity, means for sensing whether said a.f.c. voltage falls within or outside of predetermined positive and negative reference values, a grounding switch for said feedback loop, means responsive to said means for sensing for closing said grounding switch while said a.f.c. voltage falls outside said reference values to disable said a.f.c. voltage and for opening said grounding switch while said a.f.c. voltage falls between said reference values to enable said a.f.c. voltage, means for detecting interchannel noise at said f.m. detector, and means responsive to said last means while said last means detects said interchannel noise for turning said grounding switch on.

8. In a frequency modulation receiver having a local oscillator and a mixer providing an i.f. output, a detector responsive to said i.f. output of said mixer for generating a bipolar a.f.c. voltage representing the deviation of said oscillator tuning from a received carrier, an a.f.c. tuner responsive to said a.f.c. voltage and coupled to said oscillator for tuning said oscillator toward said received carrier in such sense as to tend to reduce said a.f.c. voltage to zero, bipolar diode voltage limiting means connected directly to said tuner to limit the a.f.c. voltage applied directly to said tuner to first predetermined positive and negative levels representing a first predetermined frequency difference between said frequency of said local oscillator and said frequency of said received carrier, and disabling means connected to said detector and responsive to said a.f.c. voltage for disabling said a.f.c. circuit in response to said a.f.c. voltage whenever said a.f.c. voltage exceeds second predetermined positive or negative levels representing a second predetermined frequency deviation larger than said first predetermined frequency deviation, and means for disabling said a.f.c. circuit in response to interchannel noise occurring in a band exceeding said second predetermined frequency deviation.

9. The apparatus of claim 8, wherein said a.f.c. tuner includes dc amplifier means having an input connected to said detector and an output connected to said limiting means.

10. The apparatus of claim 9, which further includes means connected to said detector for disabling said a.f.c. tuner by grounding said a.f.c. circuit.

11. The combination according to claim 10, wherein said second predetermined deviation is about 80. KHz and said interchannel noise is at least about 200. KHz above said carrier.

* * * * *